(12) United States Patent
Takikawa et al.

(10) Patent No.: US 7,298,600 B2
(45) Date of Patent: Nov. 20, 2007

(54) SEMICONDUCTOR INTEGRATED CIRCUIT DEVICE

(75) Inventors: Kumiko Takikawa, Tama (JP); Satoshi Tanaka, Kokubunji (JP); Masumi Kasahara, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/104,541

(22) Filed: Apr. 13, 2005

(65) Prior Publication Data

US 2005/0185355 A1    Aug. 25, 2005

Related U.S. Application Data

(63) Continuation of application No. 10/664,968, filed on Sep. 22, 2003, now Pat. No. 7,035,069, which is a continuation of application No. 09/785,499, filed on Feb. 20, 2001, now Pat. No. 6,665,159.

(30) Foreign Application Priority Data

Feb. 21, 2000  (JP) ................................. 00-042893

(51) Int. Cl.
*H01C 7/12* (2006.01)
(52) U.S. Cl. .......................................... 361/56; 361/119
(58) Field of Classification Search ............ 361/56–58, 361/91.1, 111, 119; 455/323
See application file for complete search history.

(56) References Cited

U.S. PATENT DOCUMENTS

| | | |
|---|---|---|
| 4,989,057 A | 1/1991 | Lu |
| 5,182,220 A | 1/1993 | Ker et al. |
| 5,541,801 A | 7/1996 | Lee et al. |
| 5,714,900 A | 2/1998 | Ehlers |
| 5,903,820 A | 5/1999 | Hagstrom |
| 5,982,165 A | 11/1999 | Bowyer et al. |
| 6,272,327 B1* | 8/2001 | Kurchuk et al. ............ 455/217 |
| 6,289,204 B1 | 9/2001 | Estes et al. |
| 6,313,874 B1 | 11/2001 | Bowyer et al. |
| 6,335,952 B1* | 1/2002 | Lee et al. .................... 375/327 |

(Continued)

FOREIGN PATENT DOCUMENTS

JP    1-230266    9/1989

(Continued)

OTHER PUBLICATIONS

Hitachi Review, vol. 81, No. 10, (Oct. 1999), pp. 17-20. (w/English-language translation).

*Primary Examiner*—Michael Sherry
*Assistant Examiner*—Danny Nguyen
(74) *Attorney, Agent, or Firm*—Mattingly, Stanger, Malur & Brundidge, P.C.

(57) ABSTRACT

Into an internal circuit to operate in a high-frequency band, there is incorporated a protective circuit of a multistage connection which is constructed to include a plurality of diode-connected transistors having a low parasitic capacity and free from a malfunction even when an input signal higher than the power supply voltage is applied. Into an internal circuit to operate in a low-frequency band, there is incorporated a protective circuit which is constructed to include one diode-connected transistor. The protective circuits include two lines of protective circuit, in which the directions of electric currents are so reversed as to protect the internal circuits against positive/negative static electricities.

12 Claims, 10 Drawing Sheets

U.S. PATENT DOCUMENTS

| | | |
|---|---|---|
| 6,366,622 B1 * | 4/2002 | Brown et al. ............... 375/322 |
| 6,400,541 B1 * | 6/2002 | Brett .......................... 361/56 |
| 6,477,148 B1 * | 11/2002 | Gardenfors et al. ........ 370/280 |
| 6,518,815 B2 | 2/2003 | Grimaldi et al. |
| 6,700,792 B1 | 3/2004 | Bando et al. |
| 6,771,475 B2 | 8/2004 | Leete |

FOREIGN PATENT DOCUMENTS

| | | |
|---|---|---|
| JP | 7-202583 | 8/1995 |

* cited by examiner

| No. | NOTED PIN & POTENTIAL DIFFERENCE | CURRENT PATH |
|---|---|---|
| 1 | Vcc(+), GND(−) | ① → ② |
| 2 | Vcc(+), S(−) | ① |
| 3 | S(+), GND(−) | ② |
| 4 | Vcc(−), S(+) | ③ |
| 5 | Vcc(−), GND(+) | ④ → ③ |
| 6 | S(−), GND(+) | ④ |

SEMICONDUCTOR INTEGRATED CIRCUIT DEVICE

This is a continuation application of U.S. Ser. No. 10/664,968, filed Sep. 22, 2003, now U.S. Pat. No. 7,035,069, which is a continuation of U.S. Ser. No. 09/785,499, filed Feb. 20, 2001 (now U.S. Pat. No. 6,665,159).

BACKGROUND OF THE INVENTION

The present invention relates to a semiconductor integrated circuit device and, more particularly, to a technique which is effective when applied, in a semiconductor integrated circuit device including circuits for processing signals from an intermediate-frequency band to a high-frequency band, to a protective technique for preventing the electrostatic breakdowns of circuit elements constructing the semiconductor integrated circuit device.

A wireless communication system (or a wireless communication mobile terminal device, as will be shortly called the "terminal device") such as a digital cellular system has its circuits of transmission line and reception line constructed to include many discrete ICs (semiconductor integrated circuit devices). A representative example of the terminal device, of which the transmission/reception line circuits are constructed of the discrete ICs, is shown in FIG. 9. The discrete ICs are serviced from semiconductor parts makers such as NEC or RF Micro Device.

On the other hand, the technique of integrating the transmission/reception units into one chip is described on pp. 17 to 20 of "Hitachi Review", Vol. 81, No. 10 (1999-10), issued by Hitachi Reviewer Co., Ltd.

On the other hand, the electrostatic breakdown protecting circuit of IC is disclosed in Japanese Patent Laid-Open No. 230266/1989, for example. In this Laid-Open, there is disclosed an electrostatic breakdown preventing circuit in which a plurality of diodes are connected in series between the terminal of an integrated circuit and a power supply line or a ground line.

In Japanese Patent Laid-Open No. 202583/1995, on the other hand, there is disclosed a CMOS protective circuit corresponding to the CMOS circuit in which a plurality of power supply voltages are mixed.

Here will be described the prior art with reference to the accompanying drawings. FIG. 9 is a schematic block diagram showing transmission/reception circuits or the like, which are packaged in the terminal device of the prior art. The ICs are individually made functionally discrete, and the portions, as individually enclosed by squares, are the discrete ICs.

In this block diagram, there are shown a transmission line and a reception line, which are connected with an antenna 1 through a duplexer 2. Both these transmission line and reception line are connected with the not-shown base band.

The reception line is constructed by connecting the antenna 1, a band-pass filter 3 packaged in the duplexer 2, a low-noise amplifier 4, a band-pass filter 5, a reception mixer 6, a band-pass filter 7, a variable-gain controlled amplifier 8 and a demodulator 9 sequentially in series. The demodulator 9 is connected with the not-shown base band.

The transmission line is constructed by connecting a modulator 11, a variable-gain controlled amplifier 12, a transmission mixer 13, a band-pass filter 14, a transmission preamplifier 15, a high-output amplifier 16, a band-pass filter 17 packaged in the duplexer 2, and the antenna 1 sequentially in series. The modulator 11 is connected with the not-shown base band. On the other hand, the demodulator 9 and the modulator 11 perform the frequency conversion in response to a station signal inputted from a VCO 18. The reception mixer 6 and the transmission mixer 13 also perform the frequency conversion in response to the station signal from a VCO 19.

The signals (in electric waves) 10, as received by the antenna 1, are sequentially processed by the individual circuits of the reception line and are sent to the base band. On the other hand, the signals, as sent from the base band, are sequentially processed by the individual circuits of the transmission line and are emitted as the electric waves 10 from the antenna 1.

The portions, as enclosed by the squares, are the discrete ICs, as has been described hereinbefore. On the other hand, the internal small squares are electrostatic breakdown protecting circuits 20 (as will be called the "protective circuits").

In the construction of the prior art thus far described, it is estimated from the handling notices described in the IC catalogue of each semiconductor parts maker that the variable-gain controlled amplifiers 8 and 12, the demodulator 9 and the modulator 11, or the intermediate-frequency band ICs of several hundreds MHz are provided with the protective circuits 20 for preventing the circuit breakdowns, as might otherwise be caused by the electrostatic charges from several tens to several hundreds V, to enhance the high breakdown voltages.

On the other hand, the high-frequency band ICs in the vicinity of 1 GHz such as the low-noise amplifier 4, the reception mixer 6, the transmission mixer 13, the transmission preamplifier 15 or the high-output amplifier 16 are described for the user to consider the static electricities, and it is also estimated that no protective circuit is included.

As one example of the protective circuit, there is known a protective circuit which is disclosed in Japanese Patent Laid-Open No. 202583/1995, as described hereinbefore. FIG. 10 is a schematic diagram in which a portion is added for easier illustration to the diagram of the protective circuit presented by the Laid-Open.

In FIG. 10, numeral 41 designates a protective circuit. Letter V designates an input or output signal to an integrated circuit, and this signal is inputted via a signal line 44 to an internal circuit 45 or outputted from the internal circuit 45. The protective circuit 41 is made of a diode-connected NMOS transistor 42 and an NMOS transistor 43. Specifically, the transistor 42 is connected at its shorted gate and drain with the signal line 44 and is connected at its source with a power supply voltage Vcc. On the other hand, the transistor 43 is connected at its drain with the signal line 44 and at its shorted gate and source with the ground.

On the other hand, one example of the protective circuit having diodes connected at multiple stages is disclosed in Japanese Patent Laid-Open No. 230266/1989, as has been described hereinbefore. FIGS. 11 and 12 are schematic diagrams in which a portion is added to the diagrams of the diodes for forming the protective circuit and the electrostatic breakdown preventing circuit of that Laid-Open, so as to facilitate the description.

As shown in FIG. 11, two diodes 51 and 52 are connected in series at two stages in the forward direction between the signal line 53 and the ground line 55 of an internal circuit 54. A signal is transmitted via the signal line 53 to the internal circuit 54. FIG. 11 omits the protective circuit on the power supply side, the action of which is identical to that shown in FIG. 10.

By the two-stage construction, a Von voltage is raised to suppress the electric current to flow through the protective circuit. FIG. 12 shows a sectional structure of the protective circuit elements constructed to have a two-stage connection. Over one face of a P-type substrate 61 forming an integrated circuit, there is formed an N-type epitaxial layer 62. On the surface side of this N-type epitaxial layer 62, there are formed a plurality of (or two, as shown) P-type diffusion layers 63 for wells. In the surface layer portion of the P-type diffusion layer 63, on the other hand, there is formed an N-type diffusion layer 64. Therefore, the P-type diffusion layer 63 and the N-type diffusion layer 64 form PN junction diodes (51 and 52).

Between the individual P-type diffusion layers 63, on the other hand, there is formed a P-type insulating diffusion layer 65 as a channel stopper. This P-type isolating diffusion layer 65 so extends all over in the thickness direction of the N-type epitaxial layer 62 as to reach the P-type substrate 61 at is lower end.

Over the surface on one side of the P-type substrate 61, on the other hand, there is formed a silicon dioxide film 66. This silicon dioxide film 66 is partially removed at its portion confronting the P-type diffusion layer 63 and the N-type diffusion layer 64, to form contact windows. Over the silicon dioxide film 66 including those contact windows, moreover, there is formed an aluminum deposited layer 67 in a predetermined pattern.

As a result, the two diodes 51 and 52 are connected in series in the forward direction by the aluminum deposited layer 67, and one diode 51 is connected at its cathode electrode 68 with the signal line 53 of the internal circuit whereas the other diode 52 is connected at its anode electrode 69 with the ground line 55.

SUMMARY OF THE INVENTION

In accordance with the miniaturization of the wireless communication mobile terminal device of recent years, there has been desired and developed a one-chip IC in which the transmission/reception band modulator/demodulator circuits and the high-frequency amplifications are integrated to correspond to the low-noise amplifier 4, the reception mixer 6, the variable-gain controlled amplifier 8, the demodulator 9, the modulator 11, the variable-gain controlled amplifier 12, the transmission mixer 13 and the transmission preamplifier 15, as shown in FIG. 9. It is necessary to protect the entire chip against the high breakdown voltage.

However, it has been found out that the one-chip IC of the prior art incorporating the protective circuit has the following problems.

(1) The high-frequency circuit including the low-noise amplifier 4, the reception mixer 6, the transmission mixer 13 and the transmission preamplifier 15 is provided at its input/output circuits with a matching circuit having a capacity and an inductance. With the inductance of this matching circuit, for example, a high voltage is generated by the change in the voltage at the input/output portions of the integrated circuit. Moreover, the output terminals of the individual circuits are biased in the DC manner to the potential of the power supply voltage. As a result, in response to the input signal, a signal having a potential no less than the power supply voltage is outputted. If the circuit having a construction of transistors of one stage is applied as the protective circuit as in the example of the prior art, a bias condition for allowing the electric current to flow through that protective circuit is established to raise a problem that the signal is distorted.

(2) On the other hand, the attachment of the protective circuit of the prior art raises a problem that the parasitic capacity is so high as to deteriorate the gain. This makes it hard to apply the protective circuit of the prior art to the circuit of the high-frequency portion.

(3) In the protective circuit having the transistors of a construction of two stages of the prior art, on the other hand, the element structure is constructed of thyristors. If a high static electricity is applied, therefore, the IC actions cannot be made because an overcurrent continuously flows unless the power supply is broken.

The problems, as found out by our investigations to be caused by the protective circuit for the high-frequency circuit, will be described with reference to FIGS. 13A and 13B and the subsequent Figures. First of all, the deterioration of the linearity will be described in the case of a circuit output.

FIGS. 13A and 13B illustrate the static characteristics of the NMOS transistors 42 and 43 of FIG. 10 and the actions of the high-frequency signals. With the circuit construction shown in FIG. 10, in the action state in which the power supply of the IC and the ground are connected with the power supply line over the substrate, little electric current flows through the transistors of the protective circuit, but the desired signal voltage is applied to the internal circuit 45, when the signal voltage Vcc desired by the circuit is applied to the signal line 44.

Next, if a positive static electricity V1 higher than the voltage Von, at which the transistors are turned ON, + the power supply voltage Vcc are applied to the signal line 44 at the time of handling the IC on the substrate, a diode forward current I flows through the NMOS transistor 42, as shown in FIG. 13A, but no overcurrent flows through the internal circuit so that the internal circuit 45 is protected.

Likewise for a high negative static electricity, if an electrostatic voltage V2' no higher than −Von is applied, as shown in FIG. 13B, a diode forward current I' flows through the transistor 43 to protect the internal circuit 45.

Here, the high-frequency circuit adopts the method the matching is made by connecting the source terminal directly with the outside of the IC and by using the capacity and the inductance so as to amplify the output drastically, the power supply voltage is applied to the IC output terminal.

The internal circuit 45 of FIG. 10 corresponds to the low-noise amplifier 4, the reception mixer 6, the transmission mixer 13 or the transmission preamplifier 15 of FIG. 9, for example. When the power supply voltage Vcc is applied to the signal line 44 to superpose a high-frequency signal, a high-frequency voltage 46 around the graph origin of FIG. 13A is applied to the transistor 42. If the high-frequency voltage amplitude is no more than Von, little high-frequency current flows through the transistor 42, and the current amplitude of the internal circuit is outputted. If the voltage amplitude becomes large over Von, however, a nonlinear high-frequency current 47 flows to the transistor 42 so that it is superposed on the output current amplitude of the internal circuit to distort the output signal.

Under this action condition, the input amplitude of the desired wave of the reception circuit is at Von or smaller so that the distortion raises no serious problem. If the interfering wave in the near band, as cannot be filtered out by the upstream circuit stage, is so large as to have a voltage amplitude at Von or higher, however, the interfering wave causes a distortion to deteriorate the S/N characteristics in the reception band. In the transmission circuit, on the other hand, the desired wave has a large output amplitude so that the S/N deterioration occurs likewise at the distortion by the desired wave.

Here will be described the case of the input point of the circuit. Where the circuit includes enhancement type transistors such as Si bipolar transistors having a bias voltage at about +1 V at their input points, the protective circuit is normally OFF even if the high-frequency voltage amplitude is inputted, so that no electric current flows through the protective transistors thereby not to distort the input signal. In the case of the depression type such as the GaAs FETs, however, when a negative voltage V3' is applied to the signal line so that the high-frequency signal is superposed, as shown in FIG. 13B, a high-frequency voltage 48 around V3' is applied to the transistor 43. If the high-frequency voltage is no higher than −Von, it hardly flows through the transistor 43 so that the signal is transmitted as it is to the internal circuit.

If the voltage exceeds the value of −Von to a large amplitude, however, a nonlinear high-frequency current 49 flows through the transistor 43 and is superposed over the input current amplitude of the internal circuit to distort the input signal.

If the input signal has a distortion, this distortion is amplified by the internal circuit so that the amplified distortion is superposed on the distortion to be caused in the intrinsic signal, thereby to deteriorate the linearity. Like the aforementioned time of the output signal, the S/N ratio is deteriorated. This is because the protective circuit for the transistors of one stage diode-connected are provided on the power supply side and on the ground side for the signal lines.

In order to solve this problem, there is a method in which the diode-connected transistors are connected in series to raise the voltage Von so that little electric current may flow at the desired voltage for the internal circuit to act, as in the aforementioned protective circuit having the two-stage construction of FIG. 11. Moreover, the series connection reduces the parasitic capacity and the deterioration in the frequency characteristics.

According to this structure, however, a portion, as designated by 70 in FIG. 12, is given the thyristor structure by inserting the P-type diffusion layer of the channel stopper. The action principle of the thyristor is shown in FIG. 14. The thyristor is in the turn-OFF state to allow little electric current to flow, when it is in the forward voltage state and at a low voltage. When the voltage rises high, the thyristor is turned ON to allow a large electric current to flow. Therefore, the protective circuit of the diode construction having the multistage connection may be turned ON with a high voltage of static electricity. In order to prevent this, the power supply has to be broken. This breakdown is difficult to realize for the transistor structure of the prior art.

In the construction where the electric current flows from the ground to the power supply, as shown in FIG. 10, no problem arises, when the power supply and the ground of the IC are connected with the wiring lines of the substrate so that the power is supplied. When the IC is charged while being handled for its assembling work, however, the protective circuit may not function. With the IC being in the floating state and with the ground being open, for example, if a plus (+) or minus (−) potential difference is established between the voltage Vcc and the signal line 44, the voltage Vcc on the plus side with respect to the minus side of the signal line becomes inverse so that no electric current flows through the protective circuit. In other words, the protective circuit is weak against the negative static electricity with respect to the voltage Vcc, and the internal circuit may be broken by the high negative static electricity.

An object of the invention is to provide a semiconductor integrated circuit device for wireless communications, which has an electrostatic breakdown protecting circuit capable of protecting an IC reliably against positive/negative static electricities.

Another object of the invention is to provide a semiconductor integrated circuit device for wireless communica-tion,s which has a protective circuit capable of protecting a low-frequency circuit (including a circuit of an intermediate-frequency band) and a circuit of a high-frequency band against the electrostatic breakdown.

Still another object of the invention is to provide a semiconductor integrated circuit device for wireless communications, which is excellent against the electrostatic breakdown while preventing the deteriorations of the linearity and gain of the high-frequency circuit.

The aforementioned and other objects and novel features of the invention will become apparent from the following description to be made with reference to the accompanying drawings.

A representative of the invention to be disclosed herein will be briefly described in the following.

For the circuit (or the low-frequency circuit) of the intermediate-frequency, protective circuits including diode-connected transistors of one stage are individually disposed on power supply lines and the ground line. For the circuit of the high-frequency band of the IC, there are incorporated, as the protective circuit having a low parasitic capacity and little deterioration of signal characteristics, multistage protective circuits in which the voltage Von is not exceeded even when a signal at the power supply voltage or higher is applied, in accordance with the action point of the applied circuit, and multistage protective circuits which are not turned ON even when a signal exceeding a negative bias potential is applied. On the other hand, the protective circuits are constructed to protect the IC, irrespective of the polarity of the static electricities to be established while the IC is being handled. Specifically, the protective circuits include: a first protective circuit for allowing an electric current to flow from a power supply line to signal lines at a protection time against an electrostatic breakdown; a second protective circuit for allowing an electric current to flow from the signal lines to the ground line; a third protective circuit for allowing an electric current to flow from the signal lines to the power supply line; and a fourth protective circuit for allowing an electric current to flow from the ground line to the signal lines. Moreover, the diode-connected transistors of the multistage connection are given a structure in which the elements (i.e., the diode-connected transistors) are isolated by an insulator capable of the thyristor action.

According to the means thus far described, (a) in the semiconductor integrated circuit device, each internal circuit of the high-frequency band is provided at its input/output portions with the protective circuit of the multistage structure so that the internal circuit can be prevented from the electrostatic breakdown, as might otherwise be caused by the high positive/negative static electricities. On the other hand, each internal circuit of the low-frequency band is provided at its input/output portions with the protective circuit of one stage so that it can be prevented from the electrostatic breakdown, as might otherwise been caused by the positive/negative static electricities.

(b) The output terminal of each internal circuit 29 of the high-frequency band is biased to the power supply voltage so that a signal at an output voltage or higher is outputted in response to the input signal. Where the protective circuit is made of the circuit including transistors of one stage construction, as in the prior art, therefore, the bias condition for the electric current to flow through the protective circuit is raised to distort the signal. In the invention, on the contrary, this signal distortion can be suppressed because the protective circuit of the multistage structure is adopted.

(c) The transistors are formed in the semiconductor regions which are electrically insulated from one another, so that the formation of the thyristor, as might otherwise be formed by the two-stage construction of transistors of the prior art, can be prevented.

(d) The protective circuit, as disposed at the input/output portions of each internal circuit of the high-frequency band is constructed to include the diode-connected transistors of the multistage structure. Therefore, the parasitic capacity is lowered to reduce the deterioration of the linearity or the gain of the high-frequency circuit.

DESCRIPTION OF THE PREFERRED EMBODIMENTS

Figure 1:
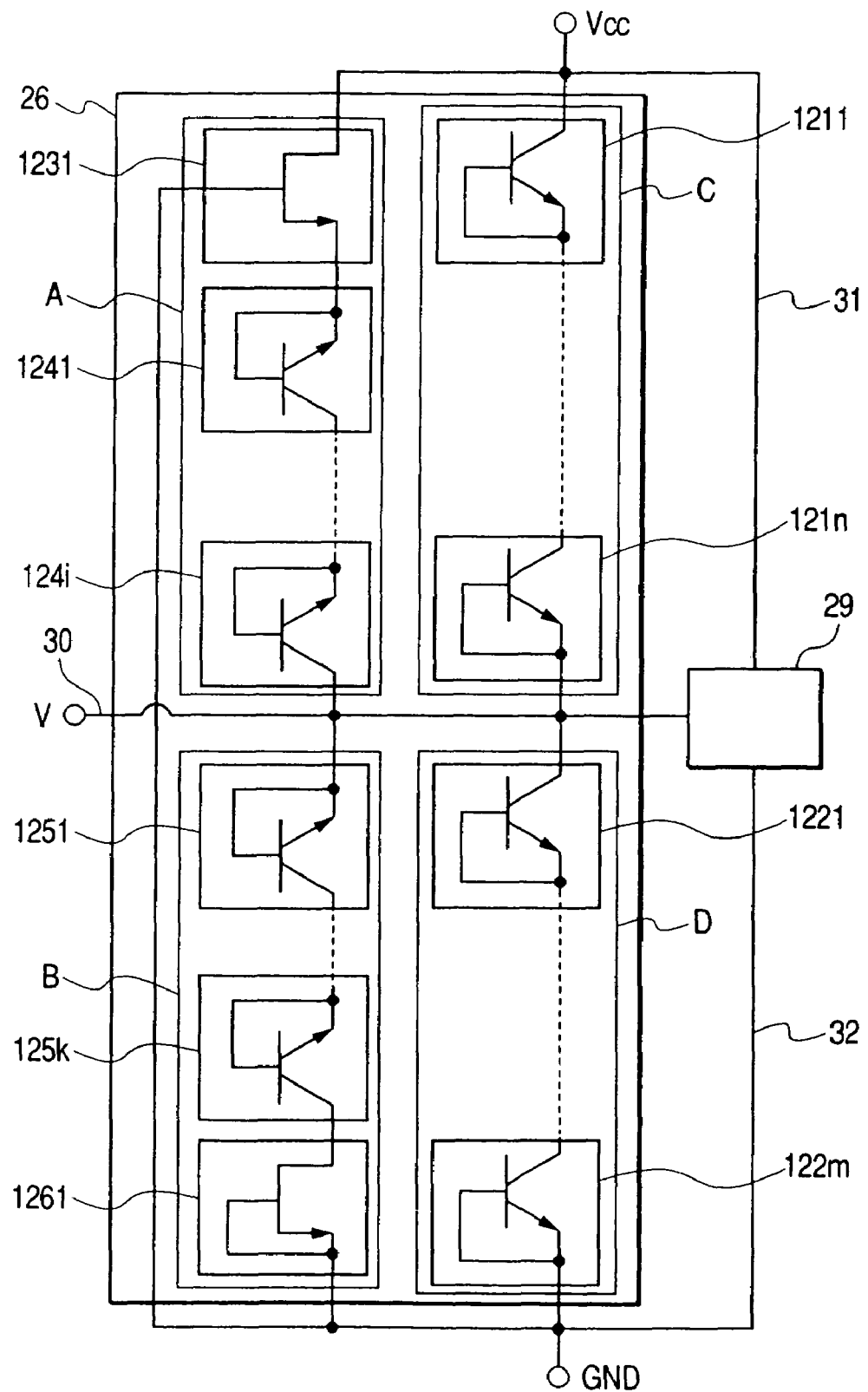
FIG. 1 is a circuit diagram showing a protective circuit to be incorporated into an internal circuit in a semiconductor integrated circuit device according to one embodiment (Embodiment 1) of the invention.

The invention will be described in detail in connection with its embodiments with reference to the accompanying drawings. Here, throughout all the Figures for explaining the embodiments of the invention, the parts having the same functions are designated by the same reference numerals, and their repeated description will be omitted.

Embodiment 1

FIGS. 1 to 7 are diagrams relating to a semiconductor integrated circuit device according to one embodiment (Embodiment 1) of the invention, and FIGS. 1 to 5 are diagrams relating to a protective circuit.

Figure 5:
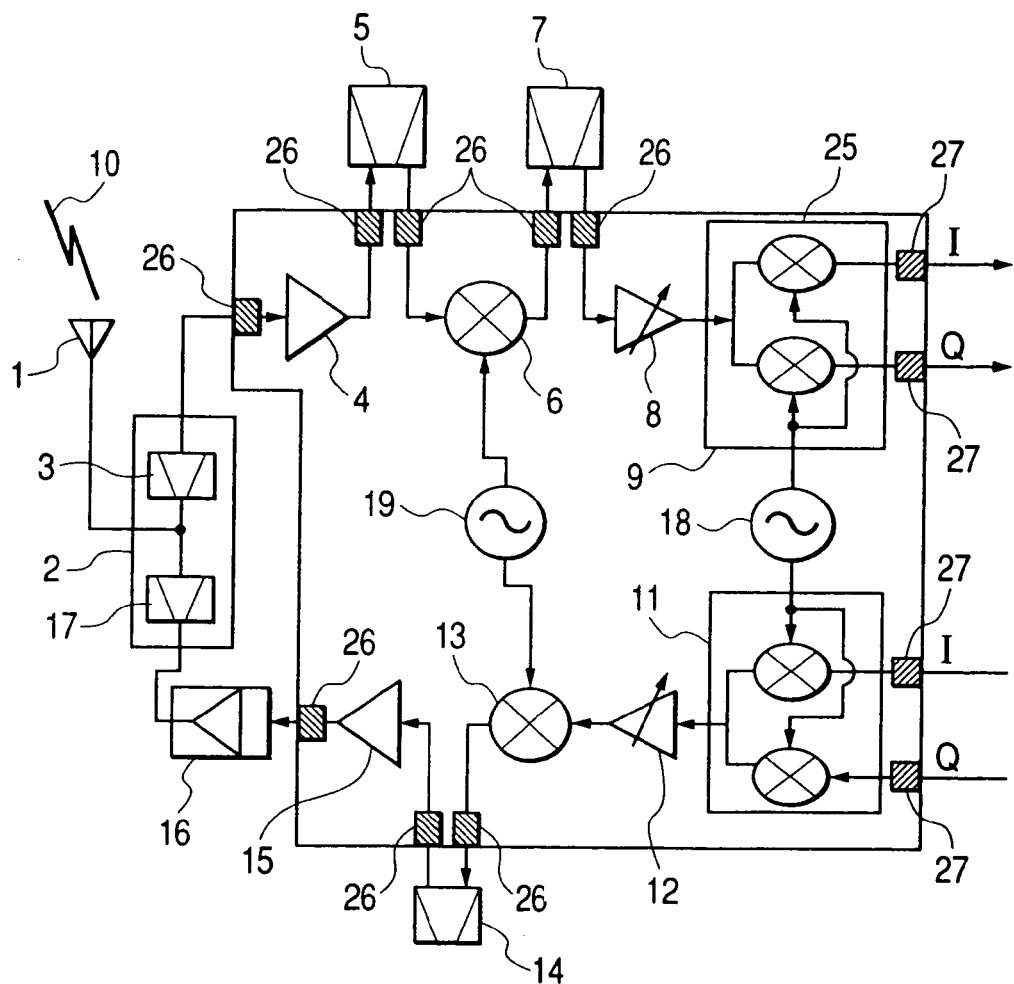
FIG. 5 is a block diagram showing a construction of a wireless communication system having the semiconductor integrated circuit device of Embodiment incorporated thereinto.

In Embodiment 1, the invention will be described on the example in which it is applied to a signal processing IC for a cellular phone. Here will be described a construction of the cellular phone. FIG. 5 is a block diagram showing a portion of a system construction of the cellular phone.

Figure 9:
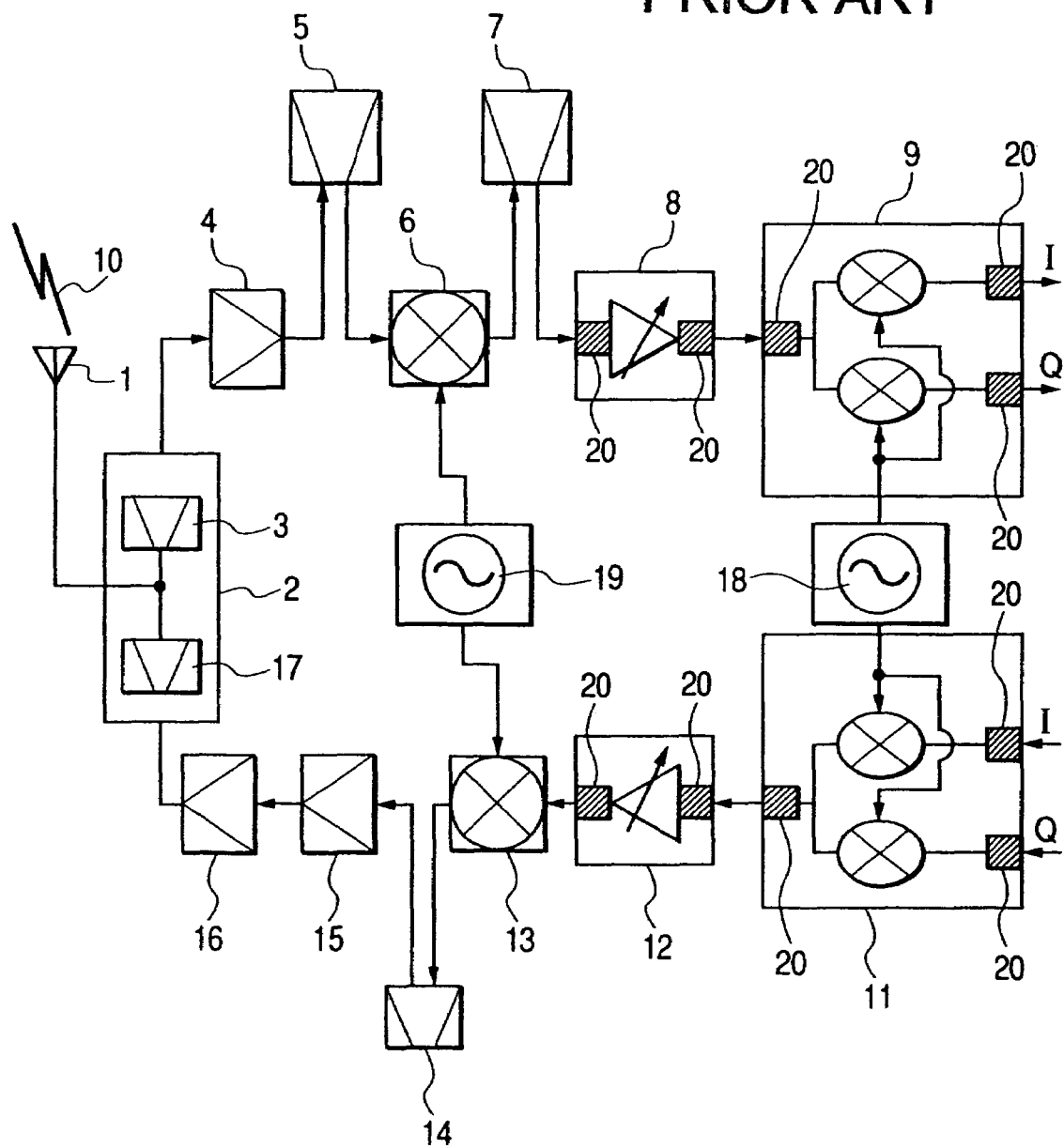
FIG. 9 is a block diagram showing a construction of a wireless communication system having the semiconductor integrated circuit device incorporated thereinto.
Figure 10:
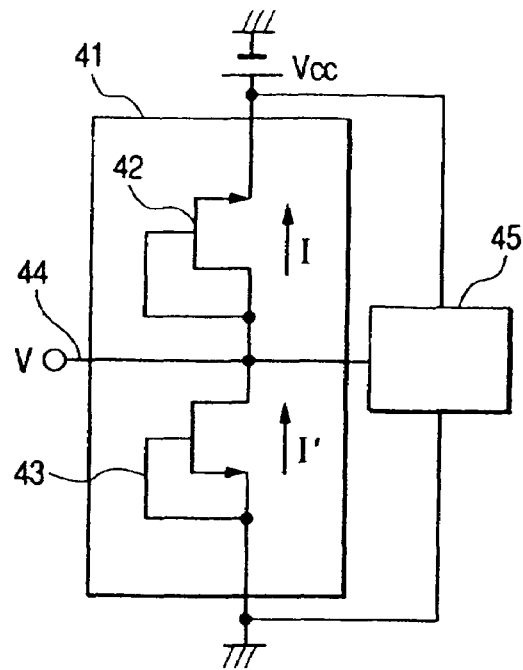
FIG. 10 is a circuit diagram showing a protective circuit.
Figure 11:
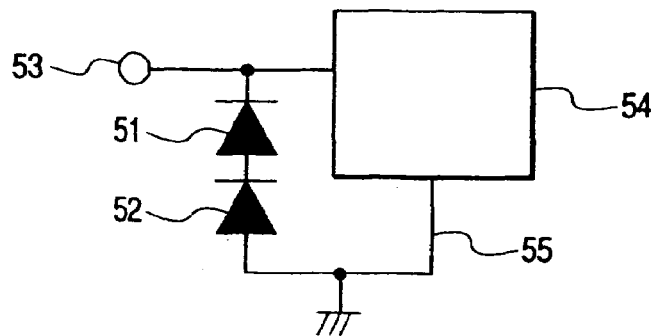
FIG. 11 is a circuit diagram showing another protective circuit.
Figure 12:
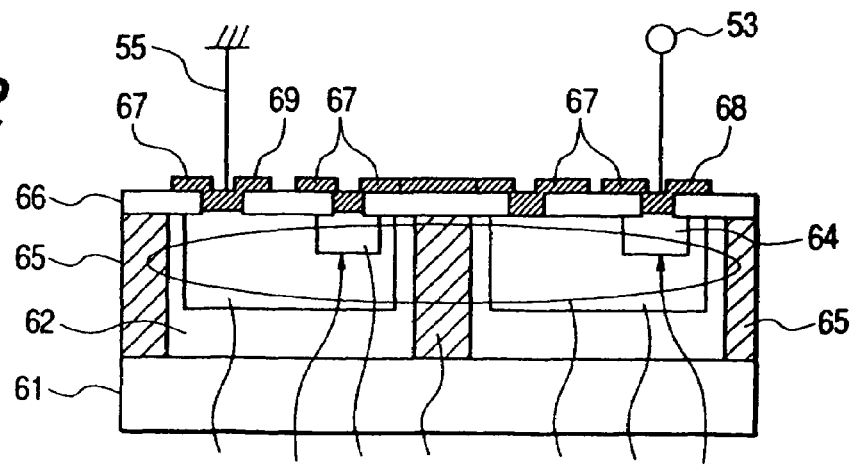
FIG. 12 is a schematic sectional diagram showing a transistor construction to be used in a protective circuit.
Figure 13A:
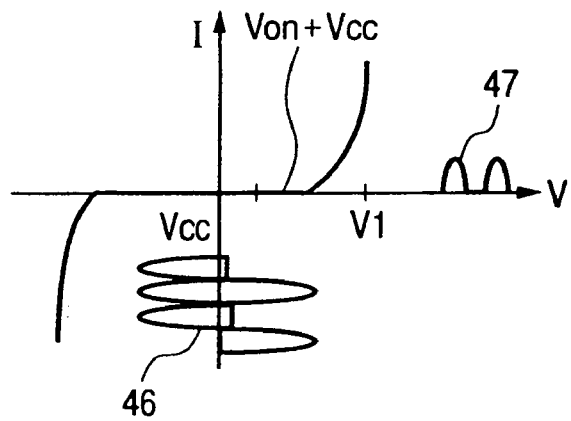
FIGS. 13A and 13B are characteristic diagrams illustrating the static characteristics used in a protective circuit of transistors and the actions of a high-frequency signal.
Figure 13B:
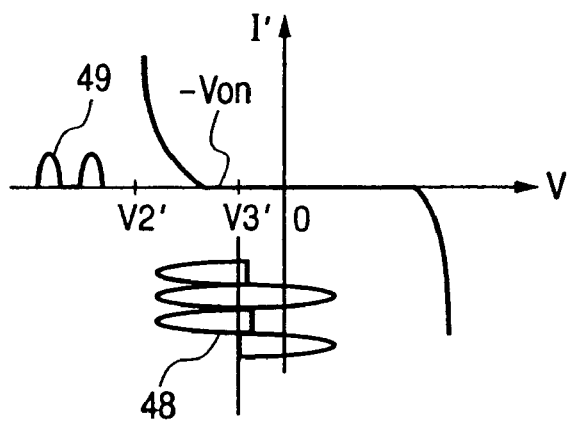
Figure 14:
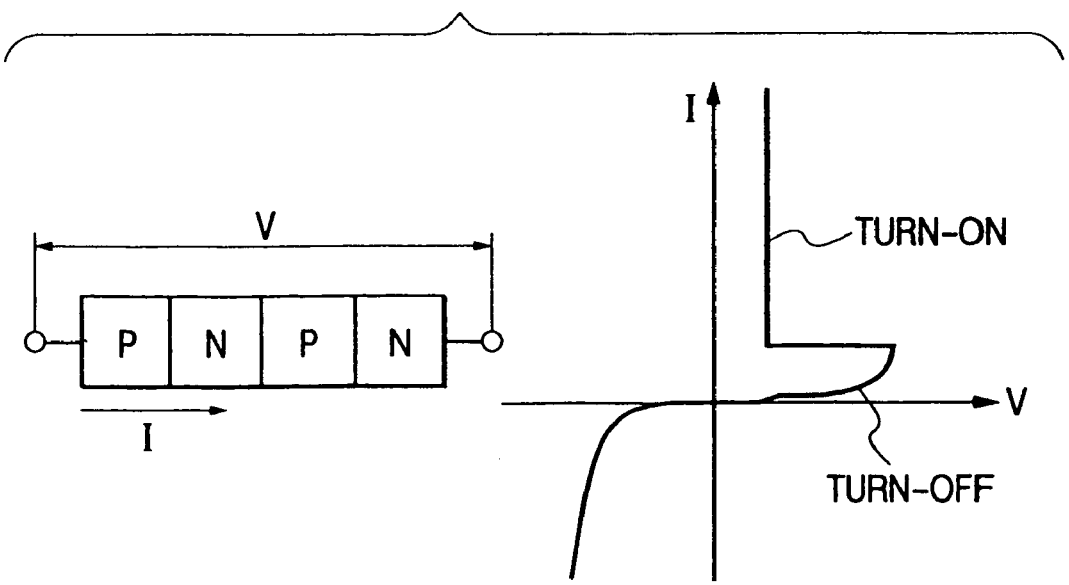
FIG. 14 is a schematic diagram showing a structure and an action principle of a thyristor.

In this block diagram, as in FIG. 9, there are shown a transmission line and a reception line which are connected with an antenna 1 through a duplexer 2. Both of these transmission line and reception line are connected with a not-shown base band.

The reception line is constructed by connecting the antenna 1, a band-pass filter 3 packaged in the duplexer 2, a low-noise amplifier 4, a band-pass filter 5, a receiving mixer 6, a band-pass filter 7, a variable-gain controlled amplifier 8 and a demodulator 9 sequentially in series. The demodulator 9 is connected with the not-shown base band.

The transmission line is constructed by connecting a modulator 11, a variable-gain controlled amplifier 12, a transmission mixer 13, a band-pass filter 14, a transmission preamplifier 15, a high-output amplifier 16, a band-pass filter 17 packaged in the duplexer 2, and the antenna 1 sequentially in series. The modulator 11 is connected with the not-shown base band. On the other hand, the demodulator 9 and the modulator 11 performs frequency conversions in response to a local oscillation signal inputted from a VCO 18. The reception mixer 6 and the transmission mixer 13 also perform frequency conversions in response to a local oscillation signal inputted from a VCO 19.

A signal (in electric waves), as received by the antenna 1, is sequentially processed by the individual circuit of the reception line and is set to the base band. On the other hand, a signal sent from the base band is sequentially processed by the individual circuits of the transmission line and is emitted as the electric waves 10 from the antenna 1. The signal 10, as emitted from the antenna 1, and the signal 10, as received by the antenna 1, are exemplified to have a high-frequency band of 1 GH, but signals of a low-frequency band are processed by the demodulator 9, the modulator 11 and so on for transferring signals with the base band. The signals of the low-frequency band are exemplified to have an intermediate-frequency band of several hundreds MHz.

In Embodiment 1, the individual circuit elements (of internal circuits) for processing signals, as including the low-noise amplifier 4 are monolithically packaged in a single semiconductor IC chip 25, as enclosed by solid lines in FIG. 5. In this semiconductor IC chip 25, more specifically, there are monolithically packaged as the internal circuits the low-noise amplifier 4, the reception mixer 6, the variable-gain controlled amplifier 8, the demodulator 9, the VCO (Voltage Controlled Oscillator) 18, the modulator 11, the variable-gain controlled amplifier 12, the transmission mixer 13, the transmission preamplifier 15 and the VCO 19.

At the input/output portions of the semiconductor IC chip 25, respectively, there are provided protective circuits which are made to stand high voltages for preventing the electrostatic breakdowns, as might otherwise be caused by the electrostatic charges (or positive/negative static electricities) from several tens to several hundreds V, of the internal circuits. These protective circuits are exemplified by protective circuits 26 of a multistage structure, in which a plurality of diode-connected transistors are connected in series, for a high-frequency band, and protective circuits 27 of one stage, in which one diode-connected transistor is used, for a low-frequency band or an intermediate-frequency band.

The protective circuit 26 of the multistage structure is disposed at the input/output portion of each of the low-noise amplifier 4, the reception mixer 6 and the transmission preamplifier 15, at the input portion of the variable-gain controlled amplifier 8, and at the output portion of the transmission mixer 13. The protective circuit 27 of the one stage is disposed at the output portion of the demodulator 9 and at the input portion of the modulator 11.

Here will be described the protective circuit 26 of the multistage structure to be disposed at the input/output portions of the high-frequency band, with reference to FIGS. 1 to 4.

Figures 2A, 2B:
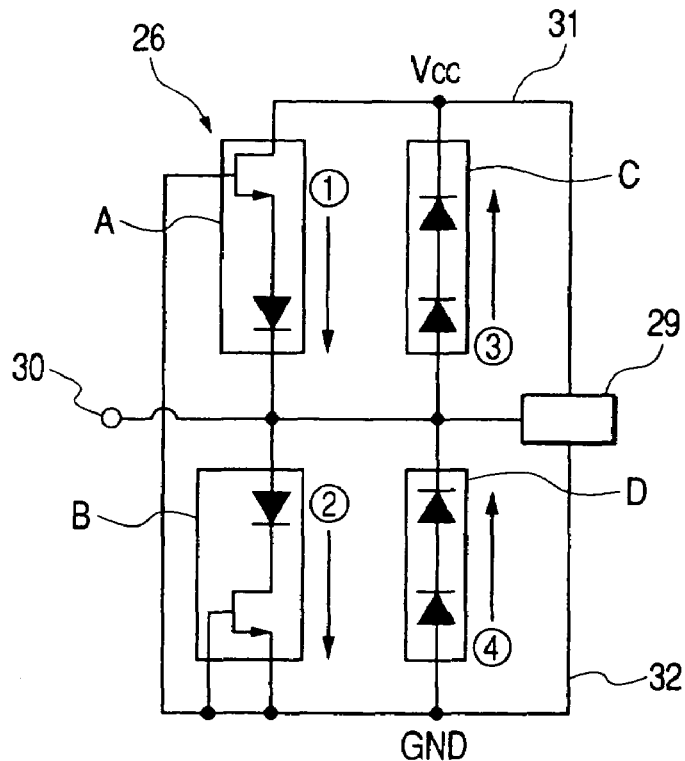
FIGS. 2A and 2B are diagrams showing individual current paths at the times when the protective circuit protects electrostatic breakdowns caused by positive/negative static electricities.

The protective circuit 26 of the multistage structure is constructed, as shown in FIG. 1 and FIGS. 2A and 2B, by arranging a diode of the multistage structure between a signal line 30, and a power supply line 31 and a ground line 32, as connected with an internal circuit 29. Letter V appearing in FIG. 1 designates an input signal or an output signal to or from the internal circuit 29 so that it is inputted or outputted via the signal line 30 to or from the internal circuit 29.

The protective circuit 26 of the multistage structure is constructed, as shown in FIGS. 2A and 2B, of: a first protective circuit A in which an electric current flows via route (1) from the power supply line 31 to the signal line 30 at the electrostatic breakdown protecting time; a second protective circuit B in which an electric current flows via route (2) from the signal line 30 to the ground line 32; a third protective circuit C in which an electric current flows via route (3) from the signal line 30 to the power supply line 31; and a fourth protective circuit D in which an electric current flows via route (4) from the ground line 32 to the signal line 30. The first protective circuit A and the second protective circuit B prevent the electrostatic breakdown of the internal circuit 29 due to the negative static electricity, and the third protective circuit C and the fourth protective circuit D prevent the electrostatic breakdown of the internal circuit 29 due to the positive static electricity.

The diodes constructing the protective circuits are exemplified by diode-connected bipolar transistors and are kept from causing the thyristor phenomenon by the later-described structure.

The third protective circuit C is given a multistage structure in which a plurality of bipolar transistors 1211 to 121n all diode-connected by shorting their bases and emitters are connected in series. The transistor 1211 at the first stage is connected at its collector with a power supply Vcc (or the power supply line 31) and at its emitter with the collector of the transistor at the downstream stage. The transistor 121n at the n-th stage is connected at its collector with the emitter of the transistor at the upstream stage and at its emitter with the signal line 30. Each transistor at the (n−1)-th stage from the second stage is connected at its collector with the emitter of the transistor at the upstream stage and at its emitter with the collector of the transistor at the downstream stage.

The fourth protective circuit D is given a multistage structure in which a plurality of bipolar transistors 1221 to 122m all diode-connected by shorting their bases and emitters are connected in series. The transistor 1221 at the first stage is connected at its collector with a signal line 30 and at its emitter with the collector of the transistor at the downstream stage. The transistor 122m at the m-th stage is connected at its collector with the emitter of the transistor at the upstream stage and at its emitter with the ground (or the ground line 32). Each transistor at the (m−1)-th stage from the second stage is connected at its collector with the emitter of the transistor at the upstream stage and at its emitter with the collector of the transistor at the downstream stage.

By thus raising the Von of the transistors 1211 to 121n connected with the power supply, the transistors are turned OFF at a desired active voltage of the internal circuit 29 so that no electric current may flow. By likewise lowering the −Von of the transistors 1221 to 122m connected with the ground, the transistors are turned OFF at a desired active voltage of the internal circuit 29 so that no electric current may flow.

The first protective circuit A is connected in parallel with the third protective circuit C and is formed of a breakdown protective circuit and diodes of a multistage connection structure. Specifically, the first protective circuit A is constructed to include: a MOS transistor 1231 constructing the breakdown protective circuit between the power supply Vcc (or the power supply line 31) and the signal line 30; and a plurality of bipolar transistors 1241 to 124i connected between the MOS transistor 1231 and the signal line 30. These transistors 1241 to 124i having a structure, in which bases and emitters are all diode-connected, and are connected in series with one another to make the multistage structure as a whole.

The MOS transistor 1231 is connected at its drain (or its one electrode) connected with the power supply line 31, at its source (or its other electrode) with the emitter of the first-stage transistor 1241, and at its gate with the ground line 32. The collector of the transistor 1241 at the first stage is connected with the emitter of the transistor at the downstream stage. The transistor 124i at the i-th stage is connected at its emitter with the collector of the transistor at the (i−1)-th stage and at its collector with the signal line 30. Each transistor at the (i−1)-th stage from the second stage is connected at its emitter with the collector of the transistor at the upstream stage and at its collector with the emitter of the transistor at the downstream stage.

The second protective circuit B is connected in parallel with the fourth protective circuit D and is formed of a breakdown protective circuit and diodes of a multistage connection construction. Specifically, the second protective circuit B is constructed to include: a plurality of bipolar transistors 1251 to 125k having bases and emitters diode-connected between the signal line 30 and the ground line 32 (or the ground) and connected in multiple stages in series; and a MOS transistor 1261 connected between the collector of the transistor 125k and the ground line 32 to construct the breakdown protective circuit. The MOS transistor 1261 is connected at its drain (or its one electrode) with the collector of the transistor 125k and connected at its gate and source (or its other electrode) with the ground line 32.

In the protective circuit 26 thus constructed, when the semiconductor IC chip 25 is handled, the paths of the electrostatic currents at the individual potential differences in the power supply line, the ground line and the signal line are shown in FIGS. 2A and 2B. For conveniences of the description, the first protective circuit A and the second protective circuit B are constructed to include transistors of one stage, and the third protective circuit C and the fourth protective circuit D are constructed to include transistors of two stages. These individual transistors are simply shown as diodes.

FIG. 2B shows the potential relations among the power supply (Vcc), the ground (GND) and the signal line (S), and which of the current paths (1) to (4) the electric current flows through in the circuits. The MOS transistor allows the electric current to flow by the punch through or the source-follower when a high static electricity is applied. As apparent from FIG. 2B, a current path is at any potential difference at any portion so that no overcurrent flows through the internal circuit 29.

If it is considered that a desired positive voltage is applied to the internal circuit 29, on the other hand, the transistors 1221 to 122m and transistors 1241 to 124i are reversely biased to cause no unnecessary leakage current to the power supply. The transistors 1211 to 121n are not turned ON either at a voltage of (Vcc+Von×n) or lower. Nor is caused the punch-through by the transistor 1261 at the desired voltage so that no leakage occurs to the ground.

Where the desired voltage is negative, the transistors 1251 to 125k and the transistors 1211 to 121n are reversely biased. The transistors 1221 to 122m are not turned ON either up to −Von×m. Nor flows the electric current through the MOS transistor 1231. Therefore, the signal is correctly transmitted between the internal circuit 29 and the terminal (V).

Figure 6:
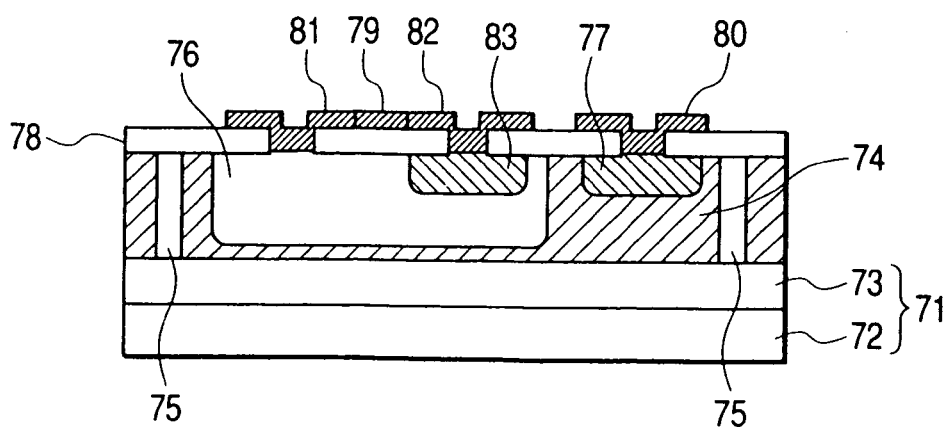
FIG. 6 is a sectional diagram showing diode-connected transistors constructing a protective circuit in the semiconductor integrated circuit device.

These bipolar transistor is given a structure, as shown in FIG. 6. The bipolar transistor is formed over an SOI (Silicon On Insulator) substrate 71 which is prepared by laminating an insulator such as a silicon dioxide layer 73 over a silicon substrate 72. Over the SOI substrate 71, there is formed an N-type epitaxial layer 74. In this N-type epitaxial layer 74, there are selectively formed endless grooves by the dry-etching method or the like. These groove extend so far as to reach the silicon dioxide layer 73. Moreover, the grooves are filled with an insulator 75. For example, the grooves are filled with silicon dioxide by the CVD (Chemical Vapor Deposition) method. Therefore, the N-type epitaxial layer 74, as enclosed by the insulator 75, is an electrically independent region. In this region, there is formed the transistor.

In the surface layer portion of the N-type epitaxial layer 74 enclosed by the insulator 75, there is formed a P-type diffusion layer 76. This region is employed as the base region. In the surface layer portions of the P-type diffusion layer 76 and the N-type epitaxial layer 74, there are formed N-type diffusion layers 77 and 83. The region 77 is employed as the collector region. The N-type diffusion layer 83, as formed in the surface layer portion of the P-type diffusion layer 76, is the emitter region.

Over the N-type epitaxial layer 74, the insulator 75, the P-type diffusion layer 76 and the N-type diffusion layers 77 and 83, on the other hand, there is formed a silicon dioxide layer 78. This silicon dioxide layer 78 is partially removed at the portions confronting the emitter/base/collector regions to form contact holes. In the regions including these contact holes, moreover, wiring lines are formed in a predetermined pattern. These wiring lines form a collector electrode 80, a base electrode 81 and an emitter electrode 82.

Figure 7:
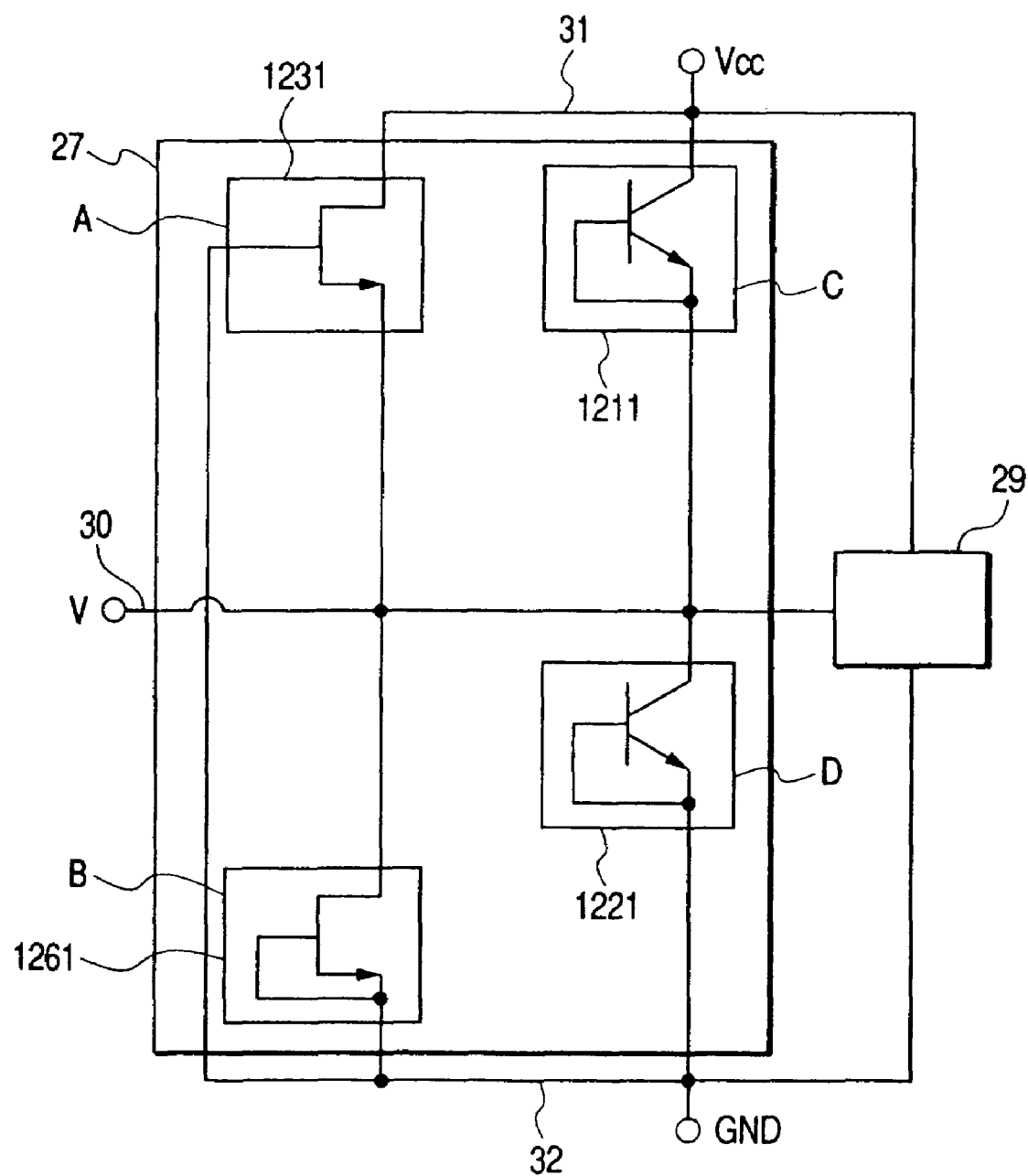
FIG. 7 is a circuit diagram showing a protective circuit to be incorporated into a low-frequency internal circuit of the wireless communication system.

Thus, the silicon dioxide layer 73 and the insulator 75 are used as barriers to form transistors which are so electrically isolated from one another as to form no thyristor. In FIG. 6, the emitter electrode 82 and the base electrode 81 are connected by a wiring line 79 to make a diode construction, and these constructions are connected at multiple stages in series to construct the protective circuit. Although the bipolar transistors have been exemplified in the description thus far made, a similar electrically insulating structure (or an isolation structure) is also used when a MOSFET is constructed. The structure of this transistor is applied to the MOS transistor 1231 in the IC circuit. FIG. 7 is a circuit diagram showing the aforementioned protective circuit 27 of one stage. In FIG. 7, the protective circuit A is constructed of the MOS transistor 1231 forming the breakdown protective circuit. This MOS transistor 1231 is connected at its drain with the power supply line 31, at its source with the signal line 30 and at its gate with the ground line 32. This breakdown protective circuit can be deemed as a protective circuit of a source-follower transistor.

The second protective circuit B, as shown in FIG. 7, has the MOS transistor 1261 constructing the breakdown protective circuit, and this MOS transistor 1261 is connected at its drain with the signal line 30 and at its source with the ground line 32. This breakdown protective circuit can be deemed as a protective circuit of the surface breakdown.

The third protective circuit C is constructed of the bipolar transistor 1211. This transistor 1211 is connected at its collector with the power supply line 31 and at its emitter with the signal line 30.

The fourth protective circuit D is constructed of the bipolar transistor 1221. This transistor 1221 is connected at its collector with the signal line 30 and at its emitter with the ground line 32.

This protective circuit 27 of the one stage prevents the damage of the internal circuit 29 due to the positive/negative static electricities like the aforementioned protective circuit 26 of the multistage structure.

Here will be described a more specific example of the circuit construction of the invention. This embodiment is especially effective when the integral circuit is constructed of a BiCMOS (BiP transistor, a P-type MOS transistor or an N-type MOS transistor).

Figure 3:
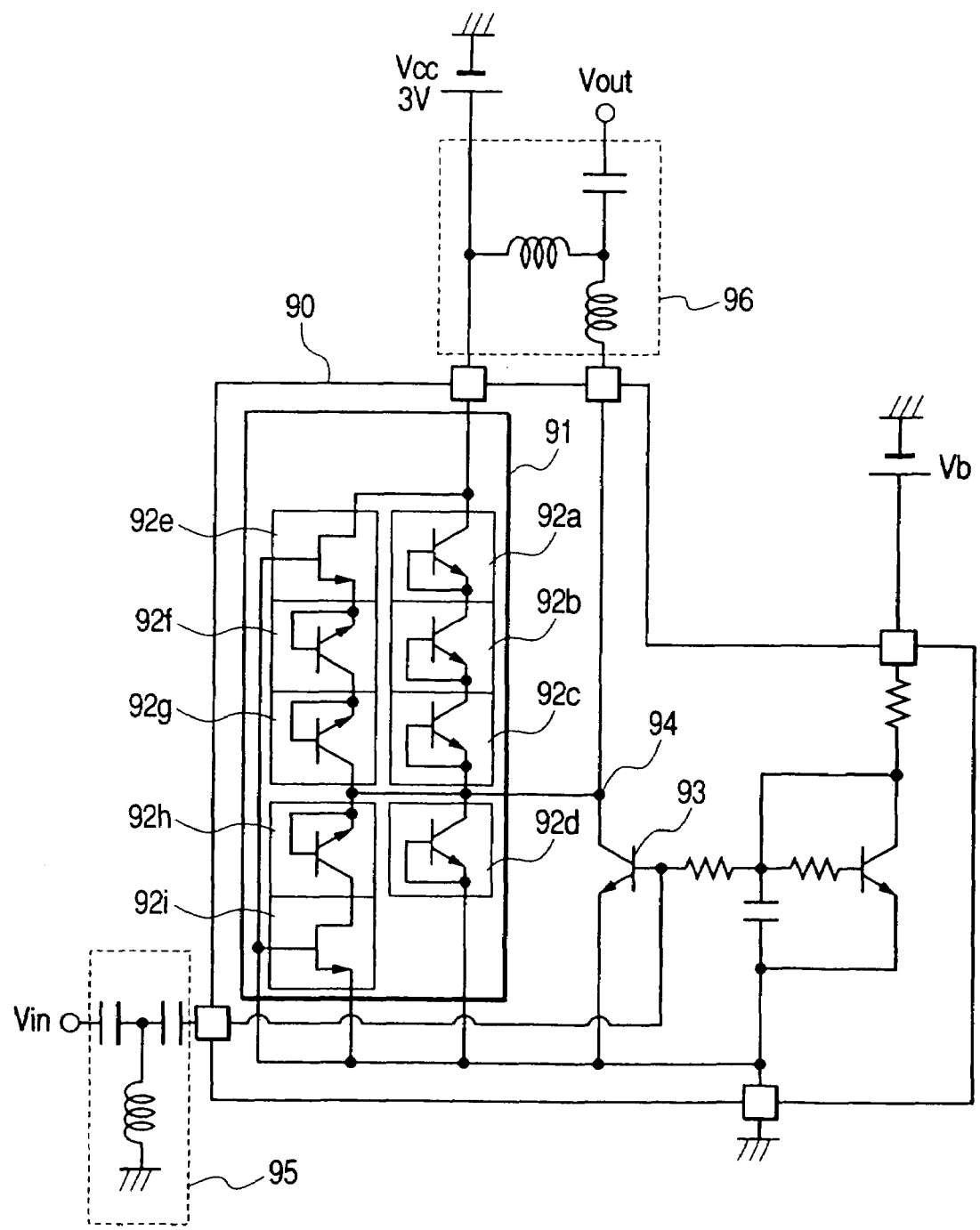
FIG. 3 is a circuit diagram showing a circuit in which the protective circuit is incorporated into an amplifier circuit as an internal circuit.

FIG. 3 shows one example of the case in which a high-frequency amplifier corresponding to the low-noise amplifier 4 of FIG. 5 is applied as the internal circuit and in which the protective circuit of the invention is disposed at the output stage. A portion 90, as enclosed by a frame, is a circuit in the IC containing the protective circuit. Circuits 95 and 96 outside of the IC are input and output matching circuits, respectively. The amplifier is a current-mirror type amplifier which is fed with a voltage Vb to feed a constant current to a transistor 93 and which is fed with a high-frequency input voltage Vin to output a signal at an amplified voltage Vout. In the circuit diagram, a portion 91 is a protective circuit which is constructed to include transistors 92a to 92i having the structure shown in FIG. 6 and isolated electrically from one another. The internal transistor 93 is fed at its collector 94 with the same voltage of 3 V as the power supply voltage via the inductor of the output matching circuit 96. If the protective circuit has only the transistor 92a of one stage, there appears at the collector terminal 94 a superposition of a forward current, which flows from the protective circuit to the power supply voltage of 3 V in accordance with the characteristics of the exponential function of the bipolar transistor, and an amplifier output current which is generated by the transistor 93. The voltage amplitude of the amplifier raises no problem, when it is extremely small, but the nonlinear current to flow through the transistor of the protective circuit increases to cause a distortion as the amplitude becomes large. In order that the voltage Von at which the transistor in the protective circuit begins to become conductive may be at 4 V as the voltage capable satisfying the dynamic range of the amplifier, the transistors of the protective circuit are connected at three stages in series to establish no electric flow at the circuit action point. The circuit of the example needs no negative power supply. By making the transistor of one stage to be connected with the ground, therefore, the circuit is protected even if a low negative static electricity is applied. By this protective circuit, moreover, the IC is protected, as described above, even the static electricity is established at the time of handling the IC.

Figure 4:
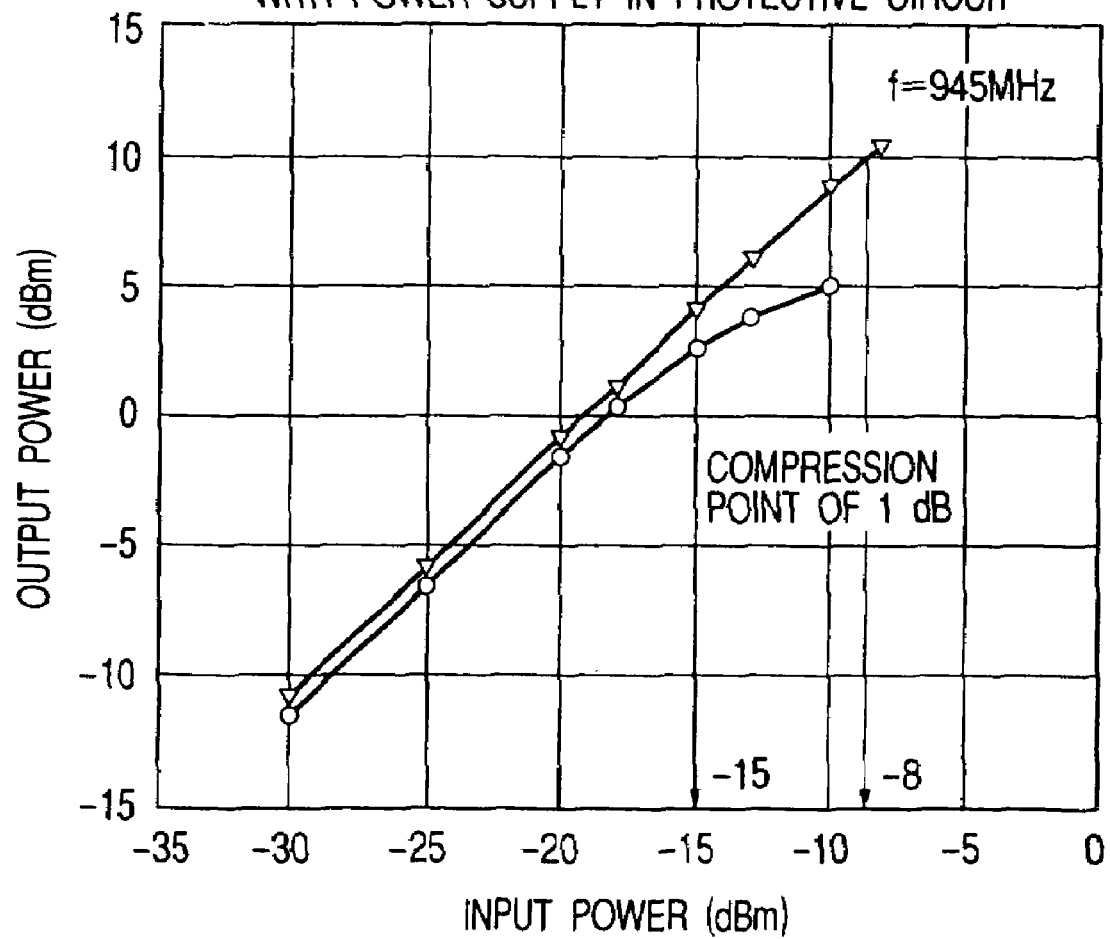
FIG. 4 is a characteristic diagram of the amplifier circuit.

FIG. 4 plots the input/output characteristics of the amplifiers when the transistors to be connected with the power supply in the protective circuit are stacked at one stage and at three stages. As apparent from FIG. 4, the one-stage series connection is changed to the three-stage series connection, the compression point of 1 dB is changed from −15 dBm to −8 dBm so that the linearity is improved. Since the collector-emitter capacity of the individual transistors are connected in series, moreover, the parasitic capacity of the protective circuit is reduced, as compared with that of the protective circuit of the prior art which is constructed to include transistors of one stage diode-connected individually with the power supply and the ground, so that the gain of the amplifier is less deteriorated. The circuit for the intermediate-frequency band has such a low frequency that the characteristic deterioration due to the parasitic capacity is remarkably small even in the protective circuit of the prior art. On the other hand, the adjoining transistors are isolated by the insulator or the silicon dioxide layer so that they do not act as the thyristor.

The description thus far made is exemplified by the output point of the enhancement type transistor. In the case of the depression type transistor input as in a GaAs FET, however, a nonlinear current is superposed on the input signal and is amplified to deteriorate the linearity likewise, if the voltage of −Von of the transistor to be connected with the ground is higher than the voltage to be applied to the gate of the transistor. This makes it necessary to provide such a protective circuit on the input side, too, that the transistors to be connected with the ground are connected in series to lower the voltage of −Von. Thus, the number of series of the transistors is determined by the action point of the internal circuit and by the target value of the compression point of 1 dB.

The semiconductor integrated circuit device of Embodiment 1 has the following effects.

(1) In the semiconductor integrated circuit device, each internal circuit 29 of the high-frequency band is provided at its input/output portions with the protective circuit 26 of the multistage structure so that the internal circuit 29 can be prevented from the electrostatic breakdown, as might otherwise be caused by the high positive/negative static electricities. On the other hand, each internal circuit of the low-frequency band is provided at its input/output portions with the protective circuit 27 of one stage so that it can be prevented from the electrostatic breakdown, as might otherwise been caused by the positive/negative static electricities.

Here, if the protective circuits of the high-frequency circuit portion are connected in series, as described hereinbefore, the voltage Von rises so that the current hardly flows to lower the electrostatic breakdown, as compared with the protective circuits of the intermediate-frequency band. However, the electrostatic voltage to break the IC (or the internal circuit) is at a level of several tens to several hundreds V, which is far higher than that of the IC to act at such a low power supply voltage as the invention is applied to. Therefore, a slight reduction in the breakdown voltage, as caused by raising the voltage Von, raise no problem.

(2) The output terminal of each internal circuit 29 of the high-frequency band is biased to the power supply voltage of a DC value so that an output voltage according to the input signal is produced at the output terminal. This output voltage is changed around the bias voltage (at about the power supply voltage) by the inductance connected with the output terminal. Where the protective circuit is made of the circuit including transistors of one stage construction, as in the prior art, therefore, the bias condition for the electric current to flow through the protective circuit is raised to distort the signal. In the invention, on the contrary, this signal distortion can be suppressed because the protective circuit of the multistage structure is adopted.

(3) The transistors are formed in the semiconductor regions which are electrically insulated from one another, so that the formation of the thyristor, as might otherwise be formed by the two-stage construction of transistors of the prior art, can be prevented.

(4) The protective circuit, as disposed at the input/output portions of each internal circuit 29 of the high-frequency band is constructed to include the diode-connected transistors of the multistage structure. Therefore, the parasitic capacity is lowered to deteriorate neither the linearity nor the gain of the high-frequency circuit.

(5) The two kinds of protective circuits, i.e., the protective circuit 26 of the multistage structure and the protective circuit 27 of the one stage are disposed in the one-chip IC so that a high breakdown voltage can be established against the electrostatic breakdown of the entirety.

Embodiment 2

Figure 8:
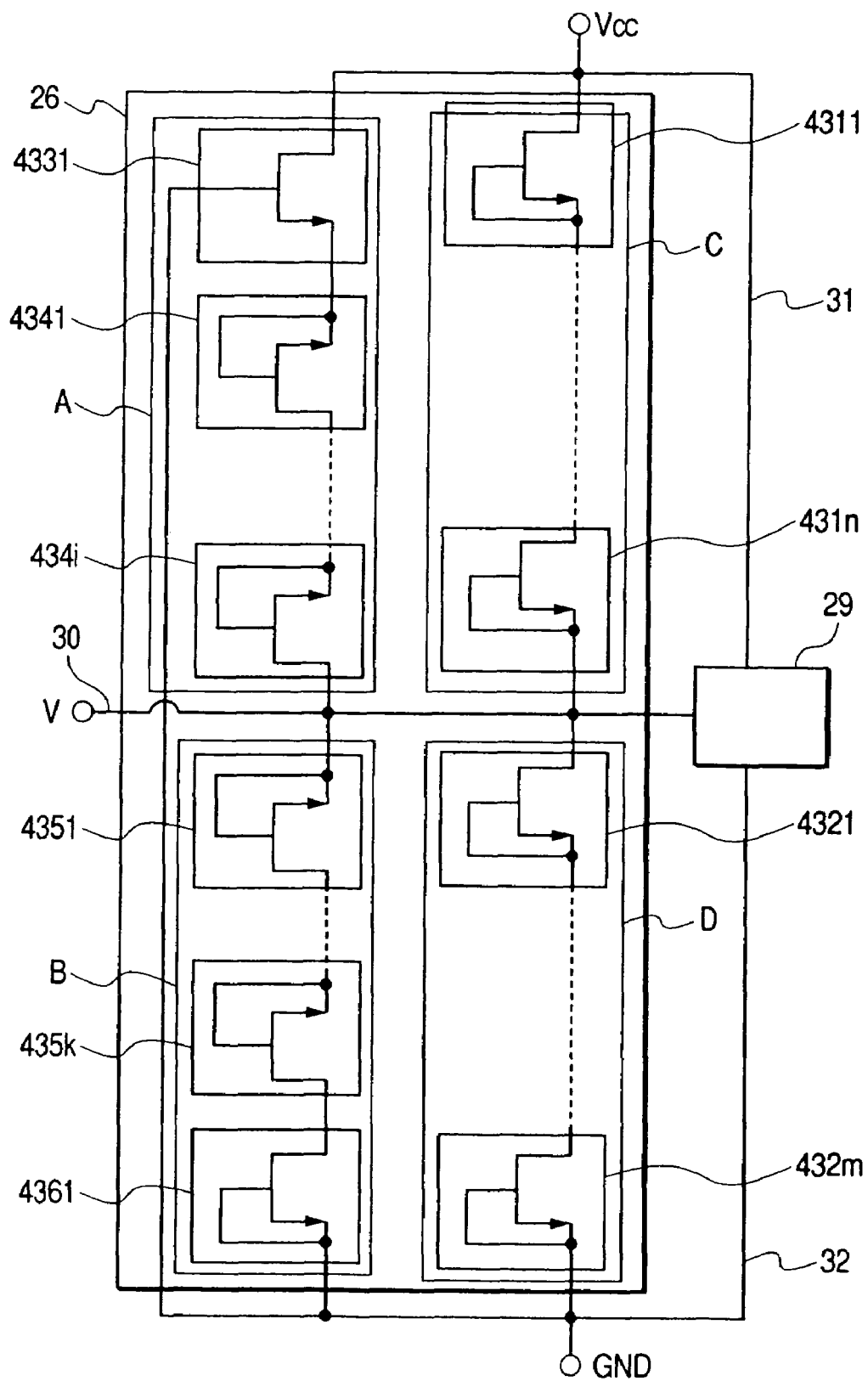
FIG. 8 is a circuit diagram showing a protective circuit to be incorporated into an internal circuit of a semiconductor integrated circuit device according to another embodiment (Embodiment 2) of the invention.

FIG. 8 shows a protective circuit of a semiconductor integrated circuit device according to another embodiment (Embodiment 2) of the invention. In the aforementioned protective circuit of the multistage structure of Embodiment 1 shown in FIG. 1, the bipolar transistors are replaced as the diode-connected transistors by MOSFETs in accordance with Embodiment 2. These MOSFETs are diode-connected by shorting their gates and sources.

The first protective circuit A is constructed to include: a MOSFET (transistor) 4331 connected between the power supply line 31 and the signal line 30 for forming a breakdown protective circuit; and a plurality of MOSFETs 4341 to 434$i$ connected between the MOSFET (transistor) 4331 and the signal line 30. The second protective circuit B is constructed to include: a plurality of MOSFETs (transistors) 4351 to 435$k$ connected in series at multiple stages between the signal line 30 and the ground line 32; and a MOSFET (transistor) 4361 connected with the MOSFET 435$k$ for forming a breakdown protective circuit. The third protective circuit C is constructed to include a plurality of MOSFETs (transistors) 4311 to 431$n$ connected in series. The fourth protective circuit D is constructed to include a plurality of MOSFETs (transistors) 4321 to 432$m$ connected in series.

In the protective circuit 26 of the multistage structure thus constructed, too, the electrostatic breakdown of the internal circuit 29, as might otherwise be caused by the positive/negative static electricities, can be prevented as in Embodiment 1.

Although our invention has been specifically described on the basis of its embodiments, it should not be limited thereto but could naturally be modified in various manners without departing from the gist thereof.

The description thus far made is directed mainly to the case in which our invention is applied to the semiconductor integrated circuit device to be incorporated into the wireless communication system belonging to the application field backgrounding the invention, but the invention should not be limited thereto. The invention can be applied to the semiconductor integrated circuit device for processing the signals.

The effects to be obtained by the representative of the invention disclosed herein will be briefly described in the following.

(1) In the one-chip IC integrating the high-frequency band and the intermediate-frequency band, according to the invention, the high-frequency circuit is provided with the protective circuits connected at multiple stages and in series, in addition to the protective circuit which is applied to the intermediate-frequency band and which is constructed to include diode-connected transistors of one stage of the prior art, so that the parasitic capacity can be lowered while raising the voltage Von to prevent the deterioration of the gain or the linearity.

(2) By thus providing the IC chip with two kinds of protective circuits of different structures as the individual circuits therein, on the other hand, the total area of the protective circuits in the chip can be made smaller than that of the structure in which the protective circuits of the multistage connection are applied to all the circuits in the IC.

(3) Thus, it is possible to realize the high breakdown voltage of the entire IC against the static electricity.

(4) It is possible to provide a semiconductor integrated circuit device for wireless communications, which has an electrostatic breakdown protecting circuit capable of protecting the IC against the positive/negative static electricities.

(5) It is possible to provide a semiconductor integrated circuit device for wireless communications, which has a protective circuit capable of protecting a low-frequency circuit (including a circuit of an intermediate-frequency band) and a circuit of a high-frequency band against the electrostatic breakdown.

(6) It is possible to provide a semiconductor integrated circuit device for wireless communications, which is so excellent against the electrostatic breakdown that it does not deteriorate the linearity and gain of the high-frequency circuit.

What is claimed is:

1. A semiconductor integrated circuit device for use in a wireless communication mobile terminal device, comprising:
    a protective circuit which is provided a high frequency signal received by an antenna of the wireless communication mobile terminal device;
    an amplifying transistor which is coupled to the protective circuit and which amplifies the high frequency signal and outputs an amplified high frequency signal; and
    a reception mixer which converts a frequency of the amplified high frequency signal into a lower frequency,
    wherein the protective circuit, the amplifying transistor and the reception mixer are formed on a same semiconductor chip of the semiconductor integrated circuit device,
    wherein the protective circuit prevents electrostatic breakdown of the semiconductor chip,
    wherein the semiconductor chip includes a first voltage line which is supplied with a first voltage and a second voltage line which is supplied with a second voltage lower than the first voltage,
    wherein the protective circuit is arranged between the first voltage line and the second voltage line and includes a signal node which receives the high frequency signal, a first protection unit which allows an electric current flow from the first voltage line to the signal node and a second protection unit which allows an electric current flow from the signal node to the second voltage line,
    wherein the first protection unit includes a plurality of first diodes which are connected in series and are arranged between the first voltage line and the signal node, and
    wherein the second protection unit includes a plurality of second diodes which are connected in series and are arranged between the signal node and the second voltage line.

2. A semiconductor integrated circuit device according to claim 1,
    wherein the amplifying transistor is a bipolar transistor and is operated as a low noise amplifier.

3. A semiconductor integrated circuit device according to claim 1,
    wherein a demodulator is also formed on the semiconductor chip,
    and wherein the demodulator responds to an output signal of the reception mixer and outputs base band I, Q reception signals.

4. A semiconductor integrated circuit device according to claim 3,
    wherein a modulator and a transmission mixer are also formed on the semiconductor chip,
    and wherein the modulator responds to base band I, Q transmitting signals and supplies an output signal thereof to an input terminal of the transmission mixer.

5. A semiconductor integrated circuit device according to claim 4,
    wherein an oscillator is also built within the semiconductor chip,
    and wherein the oscillator supplies a reception local frequency signal with the reception mixer and supplies a transmission local frequency signal with the transmission mixer.

6. A semiconductor integrated circuit device according to claim 1,
    wherein the semiconductor chip is made of silicon base material.

7. A semiconductor integrated circuit device according to claim 2,
    wherein the semiconductor chip is made of silicon base material.

8. A semiconductor integrated circuit device according to claim 3,
    wherein the semiconductor chip is made of silicon base material.

9. A semiconductor integrated circuit device according to claim 4,
    wherein the semiconductor chip is made of silicon base material.

10. A semiconductor integrated circuit device according to claim 5,
wherein the semiconductor chip is made of silicon base material.

11. A semiconductor integrated circuit device according to claim 1,
wherein the protective circuit further includes a third protection unit which allows an electric current flow from the signal node to the first voltage line and a fourth protection unit which allows an electric current flow from the second voltage line to the signal node,
wherein the third protection unit includes a plurality of third diodes which are connected in series and are arranged between the signal node and the first voltage line,
wherein the fourth protection unit includes a plurality of fourth diodes which are connected in series and are arranged between the second voltage line and the signal node.

12. A semiconductor integrated circuit device according to claim 11,
wherein the first protection unit and the third protection unit (C) are arranged in parallel between the first voltage line and the signal node,
wherein the second protection unit and the fourth protection unit (D) are arranged in parallel between the signal node and the second voltage line.

* * * * *